United States Patent
Iizuka et al.

(10) Patent No.: US 10,355,372 B2
(45) Date of Patent: Jul. 16, 2019

(54) CONDUCTOR UNIT

(71) Applicants: Yazaki Corporation, Tokyo (JP); TOYOTA JIDOSHA KABUSHIKI KAISHA, Aichi (JP)

(72) Inventors: Hayato Iizuka, Shizuoka (JP); Satoshi Nakai, Shizuoka (JP); Kazuma Kayo, Shizuoka (JP); Hiroshi Aihara, Aichi (JP)

(73) Assignees: YAZAKI CORPORATION, Tokyo (JP); TOYOTA JIDOSHA KABUSHIKI KAISHA, Aichi-Ken (JP)

( * ) Notice: Subject to any disclaimer, the term of this patent is extended or adjusted under 35 U.S.C. 154(b) by 0 days.

(21) Appl. No.: 15/907,107

(22) Filed: Feb. 27, 2018

(65) Prior Publication Data

US 2018/0261930 A1   Sep. 13, 2018

(30) Foreign Application Priority Data

Mar. 7, 2017 (JP) .................. 2017-042785

(51) Int. Cl.
*H01R 4/04* (2006.01)
*H05K 3/32* (2006.01)
(Continued)

(52) U.S. Cl.
CPC ............... *H01R 4/04* (2013.01); *H01B 1/22* (2013.01); *H01R 13/405* (2013.01); *H05K 3/321* (2013.01);
(Continued)

(58) Field of Classification Search
CPC . H01B 1/22; H01R 4/04; H05K 3/321; H05K 2201/0224; H05K 2201/10272
See application file for complete search history.

(56) References Cited

U.S. PATENT DOCUMENTS

2006/0145800 A1   7/2006   Dadafshar et al.
2009/0066454 A1   3/2009   Hansen
(Continued)

FOREIGN PATENT DOCUMENTS

JP   H06-79117 U    11/1994
JP   2003-332136 A  11/2003
(Continued)

OTHER PUBLICATIONS

The extended European search report for the related European patent application No. 18159035.7 dated Jul. 25, 2018.
(Continued)

*Primary Examiner* — Hoa C Nguyen
*Assistant Examiner* — Amol H Patel
(74) *Attorney, Agent, or Firm* — Kenealy Vaidya LLP

(57) ABSTRACT

A conductor unit includes: a plurality of conductors each including a conducting portion covered with an insulating coating; an annular core that includes a first core constituent portion and a second core constituent portion combined with the first core constituent portion, and that interposes the conductors between the first core constituent portion and the second core constituent portion; and a holding member that makes the first core constituent portion and the second core constituent portion press and hold the conductors therebetween.

6 Claims, 13 Drawing Sheets

(51) Int. Cl.
*H01B 1/22* (2006.01)
*H01R 13/405* (2006.01)
*H01R 11/09* (2006.01)
*H01R 13/03* (2006.01)

(52) U.S. Cl.
CPC .............. *H01R 11/09* (2013.01); *H01R 13/03* (2013.01); *H05K 2201/0224* (2013.01); *H05K 2201/10272* (2013.01)

(56) References Cited

U.S. PATENT DOCUMENTS

| | | | | |
|---|---|---|---|---|
| 2009/0294149 | A1* | 12/2009 | Watanabe | H01B 7/16 174/102 R |
| 2013/0105218 | A1* | 5/2013 | Kuboshima | B60R 16/0215 174/72 A |
| 2016/0255750 | A1* | 9/2016 | Yoshida | H01R 13/6593 174/359 |
| 2017/0263350 | A1* | 9/2017 | Oka | B60R 16/0215 |

FOREIGN PATENT DOCUMENTS

| | | |
|---|---|---|
| JP | 2006-261578 A | 9/2006 |
| JP | 2007-5751 A | 1/2007 |
| JP | 2009-158534 A | 7/2009 |
| JP | 4369167 B2 | 9/2009 |
| JP | 2009-295426 A | 12/2009 |
| JP | 2010-538494 A | 12/2010 |
| JP | 2012-134028 A | 7/2012 |
| WO | 2012/142011 A1 | 10/2012 |
| WO | 2013/168632 A1 | 11/2013 |

OTHER PUBLICATIONS

Japanese Office Action for the related Japanese Patent Application No. 2017-042785 dated Feb. 12, 2019.

* cited by examiner

CONDUCTOR UNIT

CROSS-REFERENCE TO RELATED APPLICATION(S)

The present application claims priority to and incorporates by reference the entire contents of Japanese Patent Application No. 2017-042785 filed in Japan on Mar. 7, 2017.

BACKGROUND OF THE INVENTION

1. Field of the Invention

The present invention relates to a conductor unit.

2. Description of the Related Art

Techniques have conventionally been developed to provide a core in a circuit. Japanese Patent Application Laid-open No. 2009-158534 discloses a technique of a reactor including a hollow tubular core having a hollow portion through which a busbar forming a circuit for performing power conversion is inserted and the busbar around which the core is disposed. The core of Japanese Patent Application Laid-open No. 2009-158534 is fixed to a circuit device body using a fixing device.

If a conductor is movable relative to the core, a friction between the conductor and the core may damage a coating of the conductor during conveyance and/or in an assembly process.

SUMMARY OF THE INVENTION

It is an object of the present invention to provide a conductor unit that can protect a coating of a conductor from being damaged.

According to one aspect of the present invention, a conductor unit includes a plurality of conductors each including a conducting portion covered with an insulating coating; an annular core that includes a first core constituent portion and a second core constituent portion combined with the first core constituent portion, and that interposes the conductors between the first core constituent portion and the second core constituent portion; and a holding member that makes the first core constituent portion and the second core constituent portion press and hold the conductors therebetween.

According to another aspect of the present invention, in the conductor unit, the first core constituent portion may have a columnar or plate-like shape, and the conductors may be busbars each having a spiral portion into which the first core constituent portion is insertable.

According to still another aspect of the present invention, in the conductor unit, the holding member may be an adhesive member that bonds the first core constituent portion and the second core constituent portion together.

According to still another aspect of the present invention, in the conductor unit, the adhesive member may be interposed between the first core constituent portion and the second core constituent portion in a circumferential direction of the core, and contain a magnetic material.

According to still another aspect of the present invention, the conductor unit may further include a plurality of connection members electrically connected to the respective conductors; and a housing member that accommodates the connection members, and the core may be accommodated in the housing member, and held by the housing member.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The following describes in detail a conductor unit according to embodiments of the present invention, with reference to the drawings. The embodiments do not limit the present invention. Components in the following embodiments include those easily conceivable by those skilled in the art, or those substantially identical thereto.

First Embodiment

Figure 1:
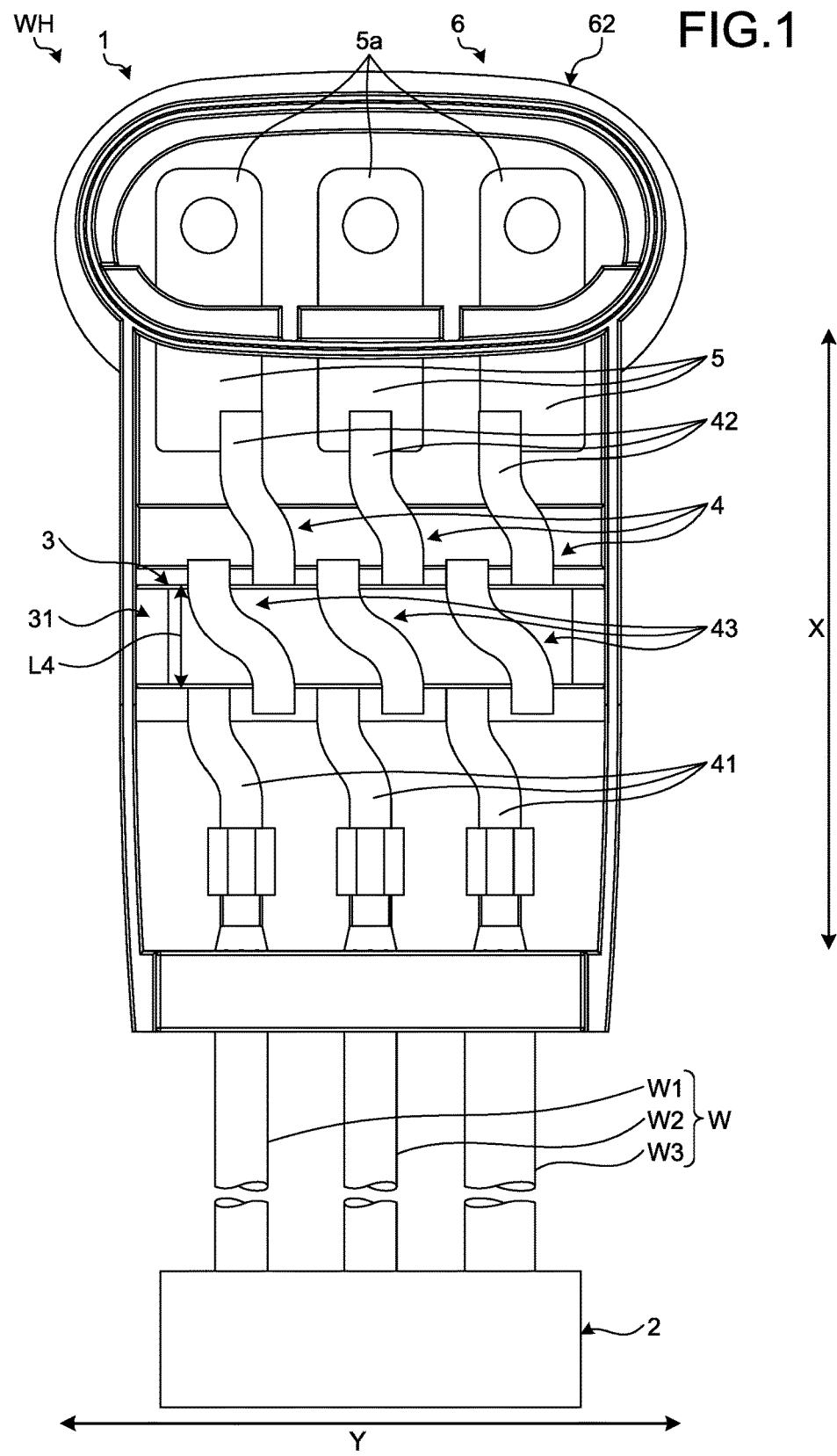
FIG. 1 is a plan view illustrating a wire harness according to a first embodiment of the present invention.
Figure 2:
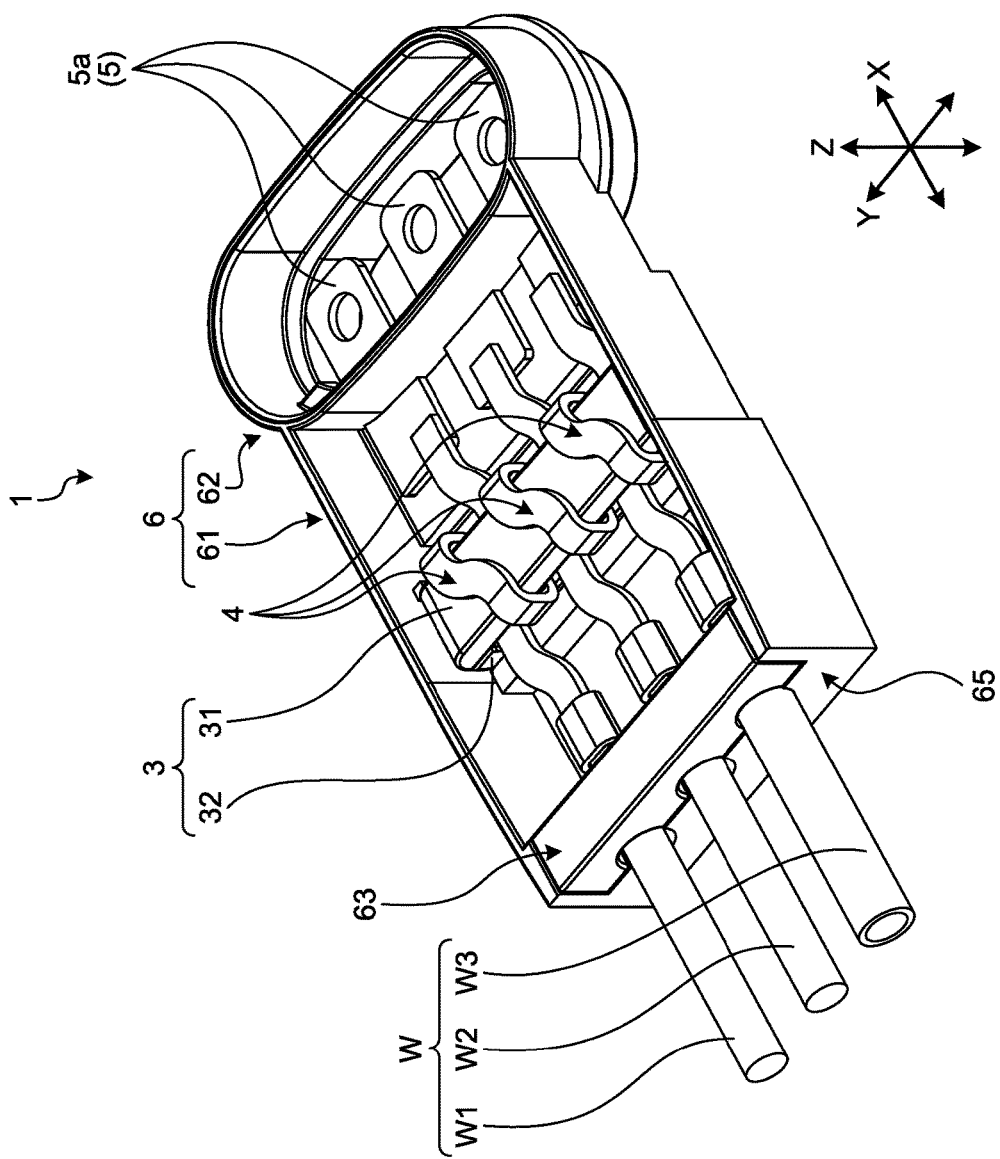
FIG. 2 is a perspective view illustrating a conductor unit according to the first embodiment.
Figure 3:
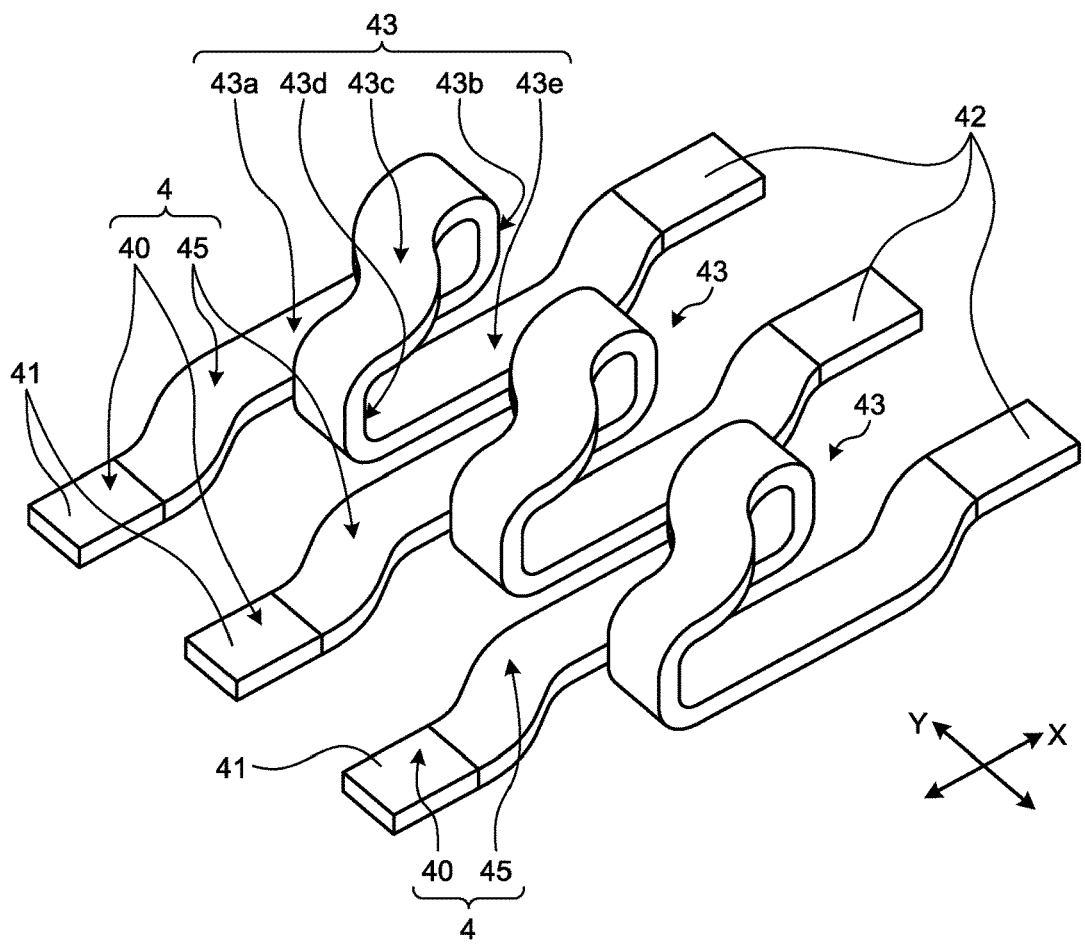
FIG. 3 is a perspective view illustrating busbars according to the first embodiment.
Figure 4:
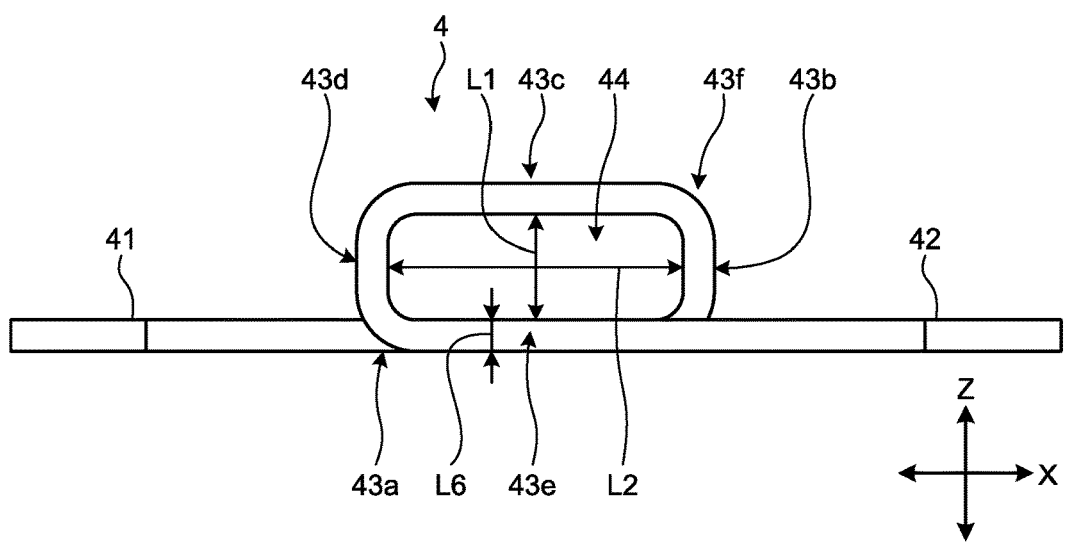
FIG. 4 is a side view illustrating the busbars according to the first embodiment.
Figure 5:
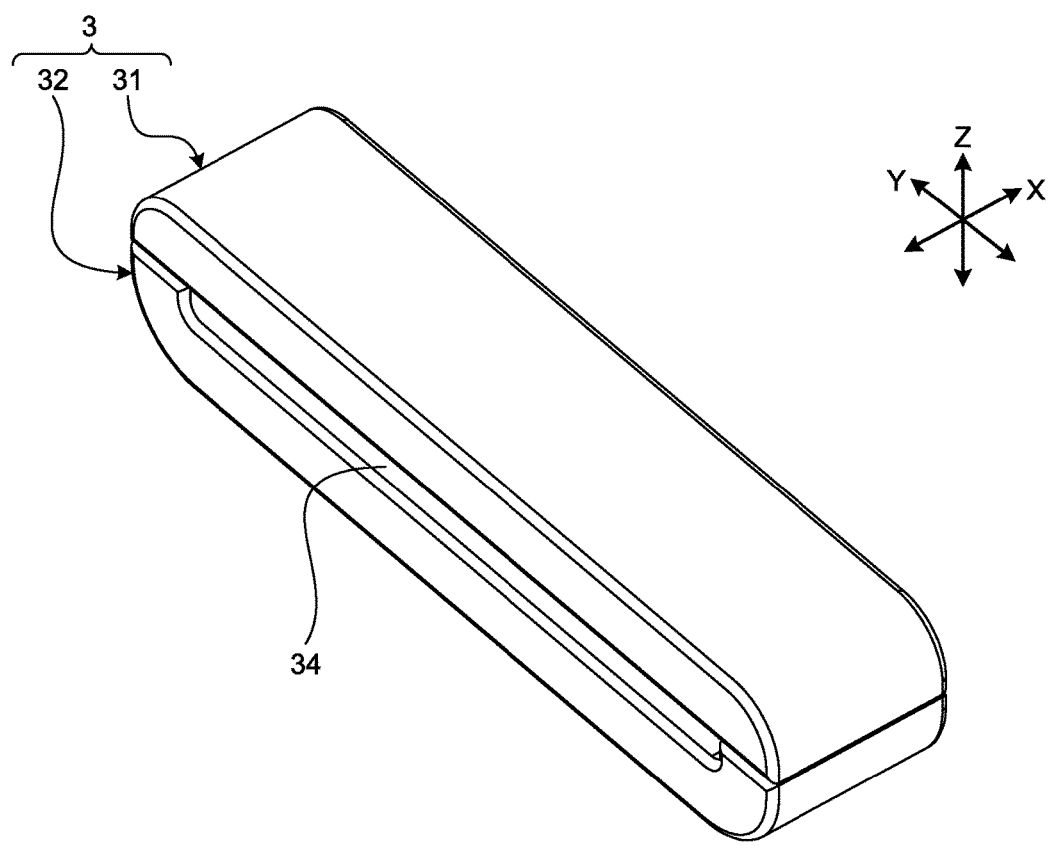
FIG. 5 is a perspective view illustrating a core according to the first embodiment.
Figure 6:
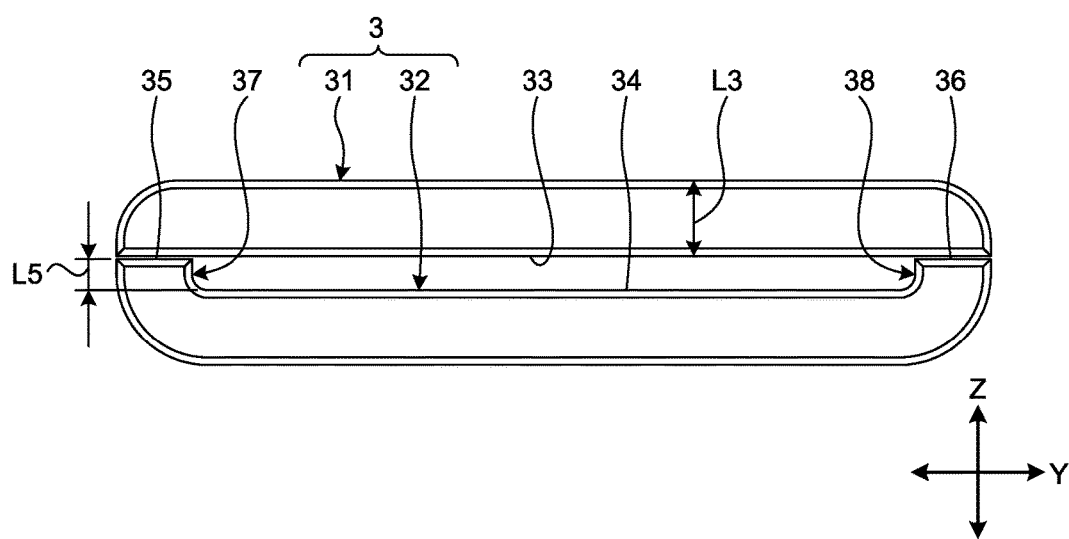
FIG. 6 is a side view illustrating the core according to the first embodiment.
Figure 7:
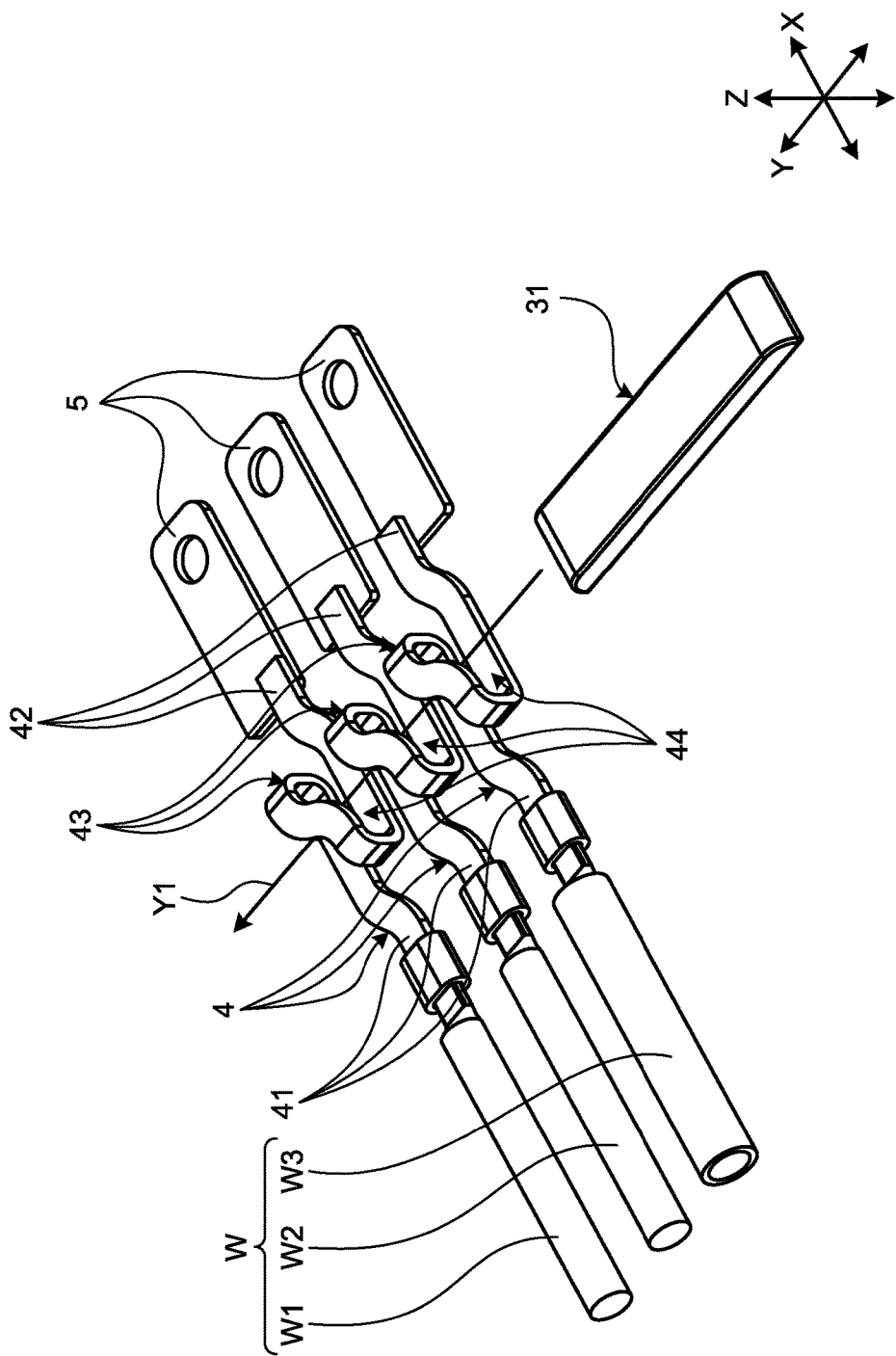
FIG. 7 is a perspective view illustrating a state of insertion of a first core constituent portion according to the first embodiment.
Figure 8:
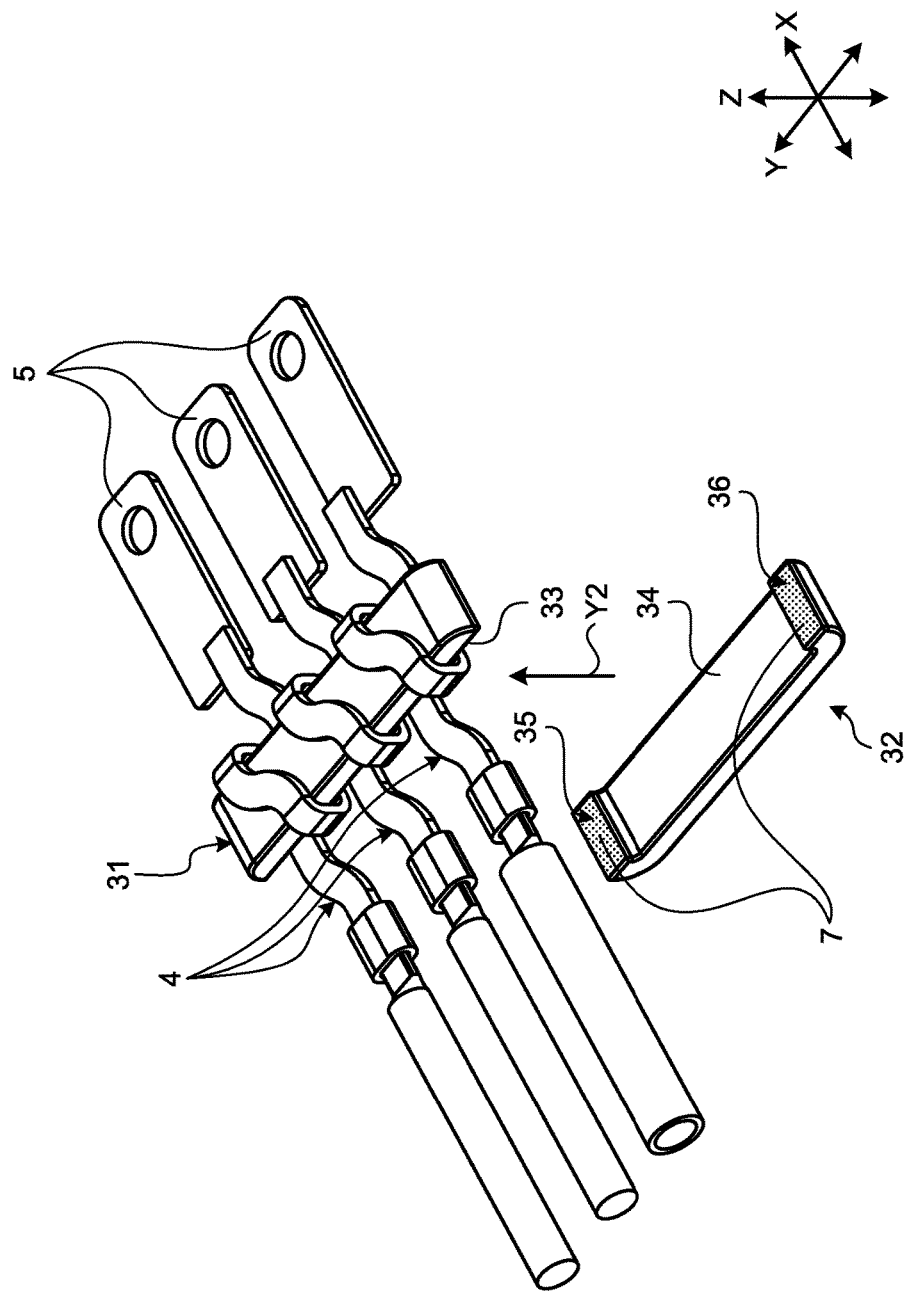
FIG. 8 is a perspective view illustrating a state of bonding of the core according to the first embodiment.
Figure 9:
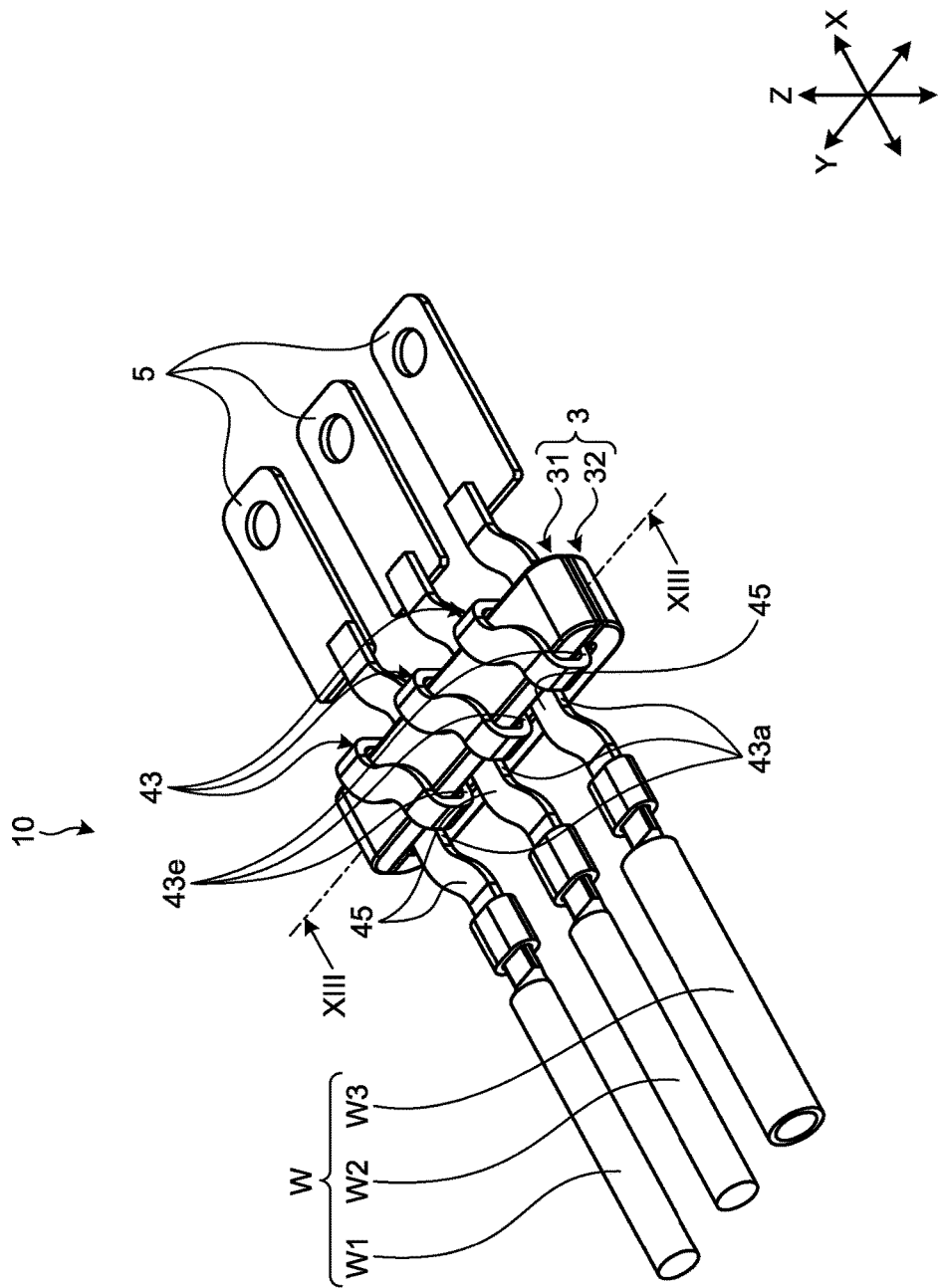
FIG. 9 is a perspective view illustrating a cored electric cable according to the first embodiment.
Figure 10:
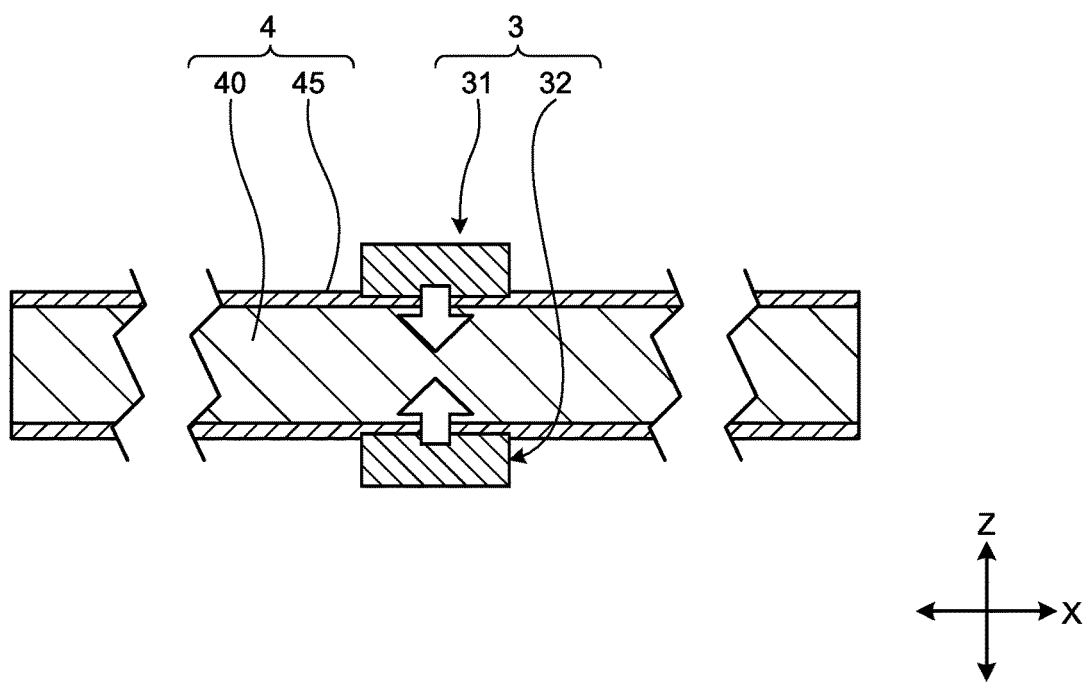
FIG. 10 is a sectional view illustrating the core compressing a coating.
Figure 11:
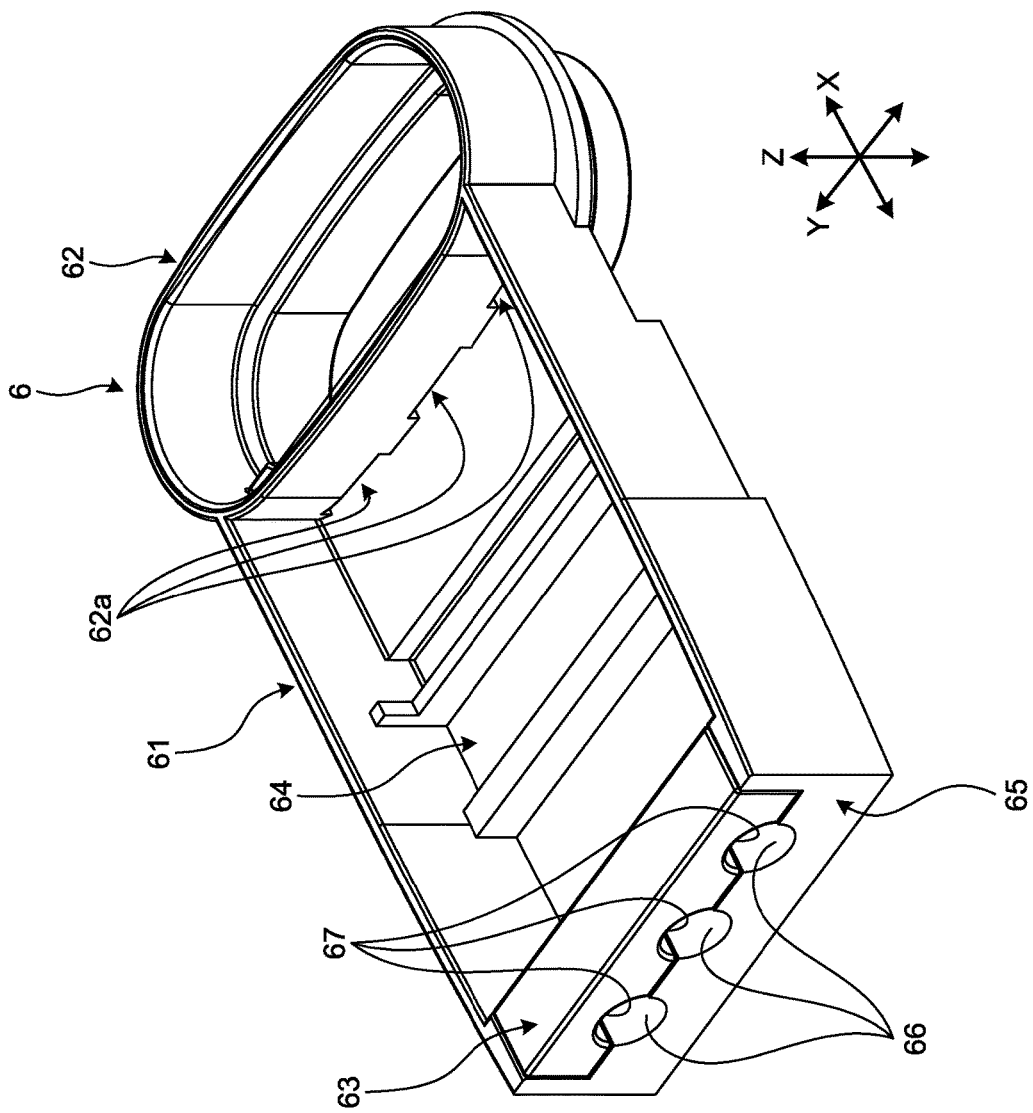
FIG. 11 is a perspective view illustrating a housing member according to the first embodiment.
Figure 12:
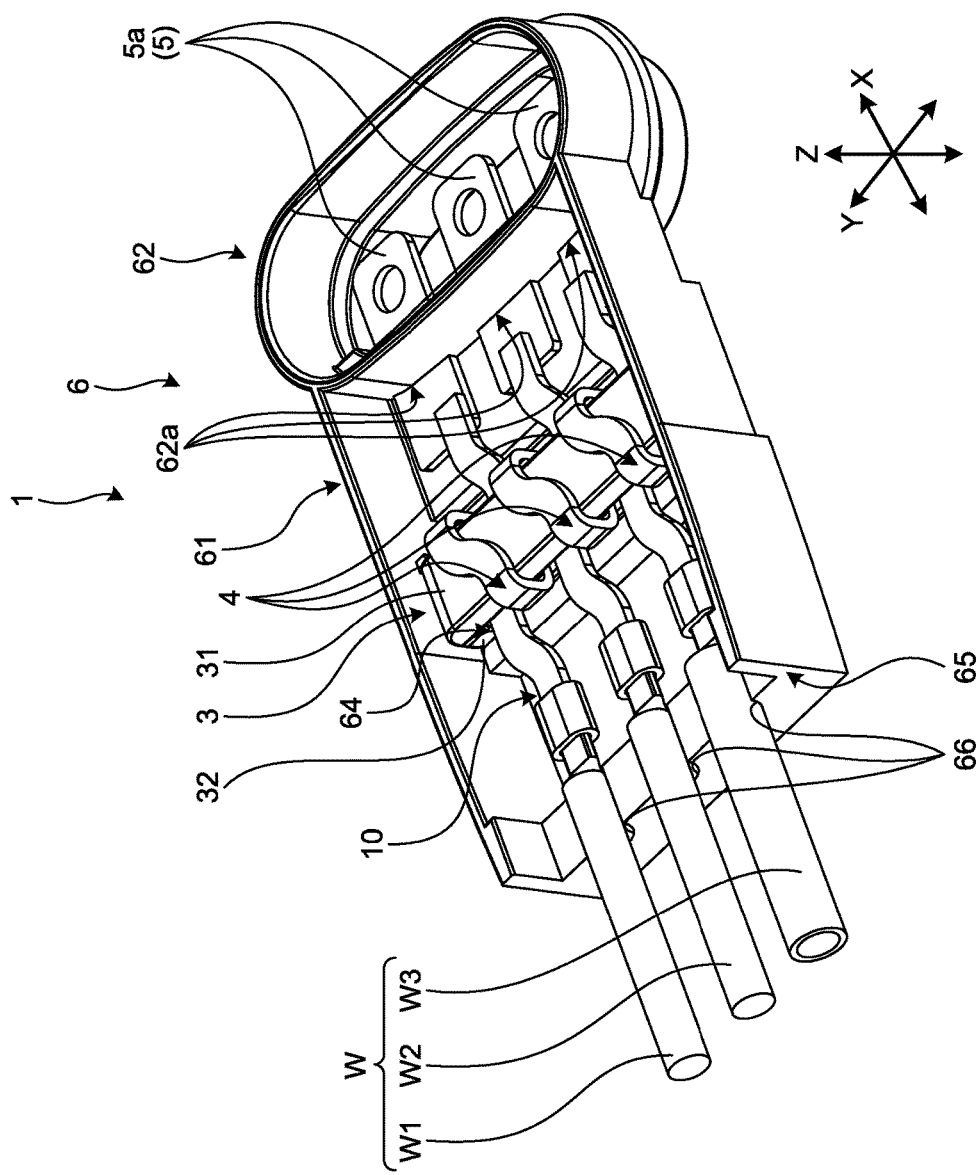
FIG. 12 is a perspective view illustrating a state of assembly of the cored electric cable into the housing member.
Figure 13:
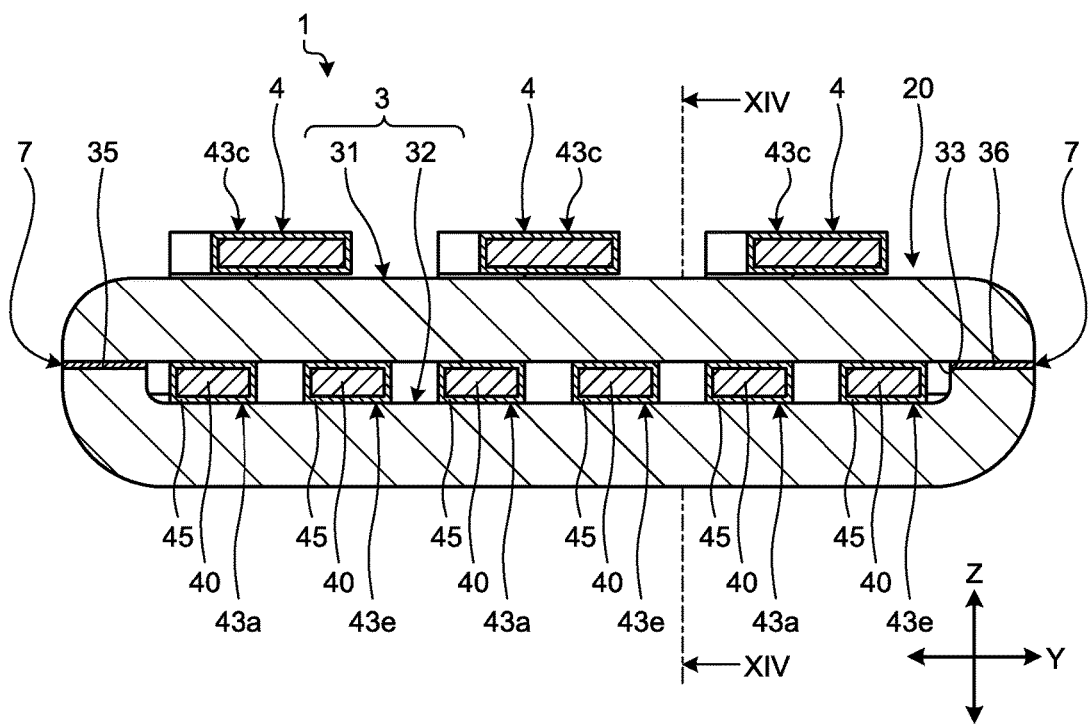
FIG. 13 is a sectional view illustrating the busbars interposed by the core.
Figure 14:
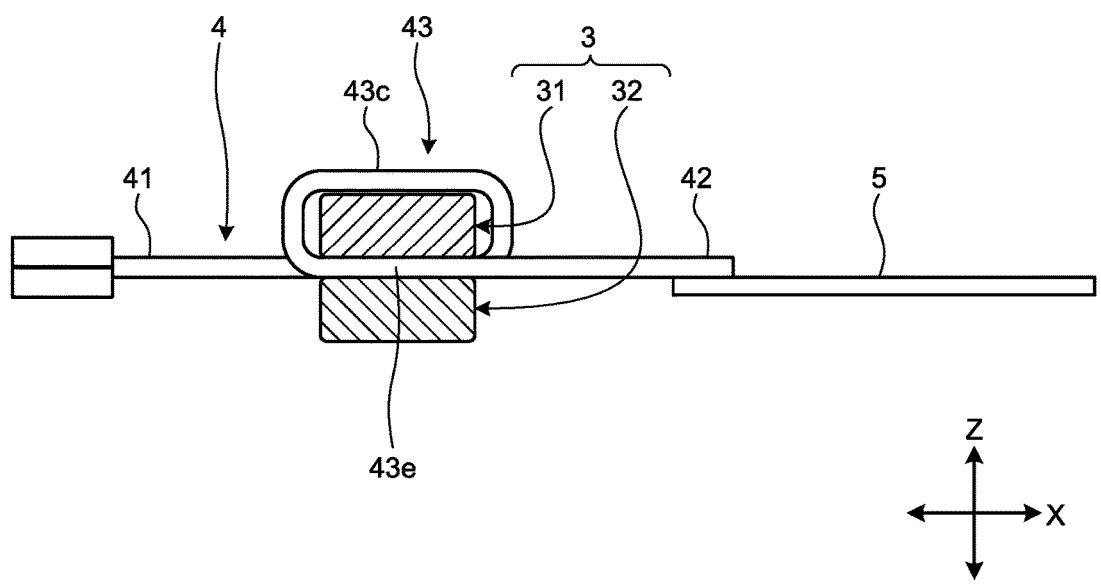
FIG. 14 is another sectional view illustrating the busbars interposed by the core.

A first embodiment of the present invention will be described with reference to FIGS. 1 to 14. The present embodiment relates to the conductor unit. FIG. 1 is a plan view illustrating a wire harness according to the first embodiment. FIG. 2 is a perspective view illustrating a conductor unit according to the first embodiment. FIG. 3 is a perspective view illustrating busbars according to the first embodiment. FIG. 4 is a side view illustrating the busbars according to the first embodiment. FIG. 5 is a perspective view illustrating a core according to the first embodiment. FIG. 6 is a side view illustrating the core according to the first embodiment. FIG. 7 is a perspective view illustrating a state of insertion of a first core constituent portion according to the first embodiment. FIG. 8 is a perspective view illustrating a state of bonding of the core according to the first embodiment. FIG. 9 is a perspective view illustrating a cored electric cable according to the first embodiment. FIG. 10 is a sectional view illustrating the core compressing a coating. FIG. 11 is a perspective view illustrating a housing member according to the first embodiment. FIG. 12 is a perspective view illustrating a state of assembly of the cored electric cable into the housing member. FIG. 13 is a sectional view illustrating the busbars interposed by the core. FIG. 14 is another sectional view illustrating the busbars interposed by the core. FIG. 13 illustrates a section XIII-XIII of FIG. 9. FIG. 14 illustrates a section XIV-XIV of FIG. 13.

As illustrated in FIG. 1, a wire harness WH according to the present embodiment includes a conductor unit 1, electric wires W, and a connector 2. The wire harness WH of the present embodiment is used, for example, as a power supply cable connecting a three-phase inverter to a motor in a vehicle. The wire harness WH is routed, for example, under a floor panel included in a vehicle body so as to extend in the vehicle front-rear direction. The wire harness WH may electrically connect the inverter disposed at a front portion of the vehicle to the motor disposed at a rear portion of the vehicle. The electric wires W are those of a three-phase three-wire system that supplies three-phase alternating current power using three electric wires W1, W2, and W3. The connector 2 is connected to one end of each of the electric wires W. The connector 2 of the present embodiment is connected, for example, to the inverter.

As illustrated in FIGS. 1 and 2, the conductor unit 1 includes an annular core 3, busbars 4, terminals 5, and a housing member 6. The conductor unit 1 further includes adhesive member 7 illustrated in FIGS. 8 and 13. The conductor unit 1 serves, for example, as a connector connected to the motor. In the following description, an axial direction X represents an axial direction of the electric wires W and the busbars 4. In other words, the axial direction X is a direction in which the wire harness WH extends, and is typically the vehicle front-rear direction. A width direction Y is a direction orthogonal to the axial direction X, and is an arrangement direction of the electric wires W. The electric wires W of the present embodiment are arranged such that the three electric wires W1, W2, and W3 lie in parallel to one another, and central axis lines thereof lie in the same plane. The width direction Y is a direction orthogonal to the axial direction X in an imaginary plane formed by the central axis lines of the three electric wires W1, W2, and W3. A height direction Z is a direction orthogonal to each of the axial direction X and the width direction Y.

The busbars 4 are conductors for electrically connecting the electric wires W to the terminals 5. Each of the busbars 4 of the present embodiment includes a conducting portion 40 and an insulating coating 45, as illustrated in FIG. 3. The conducting portion 40 is made of a conductive metal, such as copper. The coating 45 covers the conducting portion 40. The coating 45 of the present embodiment is applied to a portion other than a first end portion 41 and a second end portion 42, which are described later. In other words, the conducting portion 40 is exposed at the first and the second end portions 41 and 42.

As illustrated in FIGS. 3 and 4, the busbar 4 is formed in a spiral manner as a whole. More in detail, the busbar 4 includes the first end portion 41, the second end portion 42, and a spiral portion 43. The first end portion 41, the second end portion 42, and the spiral portion 43 are an integrated body. The conducting portion 40 of the busbar 4 is formed, for example, by bending a metal plate. The coating 45 is provided on a surface of the conducting portion 40, for example, by being applied or painted thereon. The coating 45 is provided on the busbar 4 of the present embodiment so as to expose the first and the second end portions 41 and 42. The first and second end portions 41 and 42 are flat plate-like constituent portions.

The spiral portion 43 is a portion wound into a spiral shape. The shape of the spiral portion 43 corresponds to the sectional shape of a first core constituent portion 31 described later. The spiral portion 43 is formed into a shape into which the first core constituent portion 31 is insertable. The spiral portion 43 includes a first constituent portion 43a, a second constituent portion 43b, a third constituent portion 43c, a fourth constituent portion 43d, and a fifth constituent portion 43e. The first constituent portion 43a, the third constituent portion 43c, and the fifth constituent portion 43e extend along the axial direction X. The second constituent portion 43b and the fourth constituent portion 43d extend along the height direction Z.

In the spiral portion 43, the first constituent portion 43a, the second constituent portion 43b, the third constituent portion 43c, the fourth constituent portion 43d, and the fifth constituent portion 43e are connected in this order. The first constituent portion 43a is connected to the first end portion 41. As illustrated, for example, in FIG. 1, the first end portion 41 is electrically connected to corresponding one of the electric wires W. The fifth constituent portion 43e is connected to the second end portion 42. As illustrated, for example, in FIG. 1, corresponding one of the terminals 5 is electrically connected to the second end portion 42.

As illustrated in FIG. 4, the first to fifth constituent portions 43a, 43b, 43c, 43d, and 43e form a passage portion 44 having a rectangular sectional shape. In other words, the spiral portion 43 is wound so as to have a rectangular shape when viewed from the width direction Y. Adjacent constituent portions of the first to fifth constituent portions 43a, 43b, 43c, 43d, and 43e are connected to each other so as to be orthogonal to each other. For example, the second constituent portion 43b is connected to the third constituent portion 43c at a corner portion 43f, and the extending direction of the second constituent portion 43b is orthogonal to that of the third constituent portion 43c. In other words, one side of the metal plate bent at a right angle at the corner portion 43f serves as the second constituent portion 43b, and the other side thereof serves as the third constituent portion 43c. In this manner, the spiral portion 43 is formed by bending the metal plate at right angles at four portions so as to have a spiral shape as a whole. A height L1 of the passage portion 44 is slightly larger than a thickness L3 of the first core constituent portion 31 (refer to FIG. 6). A width L2 of the passage portion 44 is slightly larger than a width L4 of the first core constituent portion 31 (refer to FIG. 1).

As illustrated in FIGS. 5 and 6, the core 3 includes the first core constituent portion 31 and a second core constituent portion 32 that are separately provided. The core 3 interposes the busbars 4 between the first core constituent portion 31 and the second core constituent portion 32. The first and second core constituent portions 31 and 32 of the present embodiment are made of a magnetic material (for example, a ferromagnetic material, such as ferrite). The first core constituent portion 31 is a flat plate-shaped or rectangular column-shaped constituent portion. The second core constituent portion 32 is a U-shaped or C-shaped constituent portion. Combining the first core constituent portion 31 with the second core constituent portion 32 forms the annular core 3. As illustrated in FIG. 6, the core 3 has an O-shape in a front view.

The first core constituent portion 31 has an opposing surface 33. The opposing surface 33 is a surface opposed to the second core constituent portion 32. The opposing surface 33 of the present embodiment is a flat surface. The second core constituent portion 32 has an opposing surface 34. The opposing surface 34 is a surface corresponding to an inner circumferential surface of the core 3. The opposing surface 34 is opposed to the opposing surface 33 of the first core constituent portion 31. In the core 3 of the present embodiment, the opposing surface 33 is parallel to the opposing surface 34. The core 3 interposes the busbars 4 between the opposing surface 33 and the opposing surface 34. On the second core constituent portion 32, end surfaces 35 and 36 at both ends of the U-shape are surfaces parallel to the opposing surface 34. The end surfaces 35 and 36 are bonded to the opposing surface 33 via the adhesive member 7 described later.

A method for fixing the core 3 to the busbars 4 will be described with reference to FIGS. 7 and 8. As illustrated in FIG. 7, the first core constituent portion 31 is inserted into the busbars 4. The electric wires W and the terminals 5 have been connected in advance to the respective busbars 4. The first core constituent portion 31 is sequentially inserted into the passage portions 44 of the three busbars 4. The insertion of the first core constituent portion 31 into the three passage portions 44 arranges the three busbars 4. More specifically, the three busbars 4 are arranged such that the spiral portions 43 are opposed to one another in the width direction Y. In the present embodiment, the three busbars 4 are arranged at even intervals along the width direction Y. A positioning jig or the like may be used to arrange the three busbars 4 at appropriate intervals in the width direction Y.

Then, the first core constituent portion 31 is combined with the second core constituent portion 32, as illustrated in FIG. 8. In the present embodiment, the adhesive member 7 bonds the first core constituent portion 31 and the second core constituent portion 32 together. The adhesive member 7 of the present embodiment is an adhesive material. The adhesive member 7 is applied to each of the end surfaces 35 and 36 of the second core constituent portion 32. The second core constituent portion 32 is pressed to the first core constituent portion 31 in a direction indicated by an arrow Y2. The second core constituent portion 32 interposes the three busbars 4 between itself and the first core constituent portion 31. The adhesive member 7 applied to the end surfaces 35 and 36 is pressed to the opposing surface 33 of the first core constituent portion 31 to bond the first core constituent portion 31 and the second core constituent portion 32 together.

The core 3 of the present embodiment is configured to make the first and the second core constituent portions 31 and 32 press and hold the busbars 4 therebetween. Specifically, a projecting height L5 illustrated in FIG. 6 is smaller than a thickness L6 of the busbars 4 (refer to FIG. 4). The projecting height L5 is a projection amount of projecting portions 37 and 38 of the second core constituent portion 32. The projecting portions 37 and 38 are portions projecting from the opposing surface 34 toward the height direction Z. A surface at a distal end of the projecting portion 37 serves as the end surface 35, and a surface at a distal end of the projecting portion 38 serves as the end surface 36. The projecting portions 37 and 38 have the same projecting height L5. The value of the projecting height L5 is set such that the opposing surfaces 33 and 34 abut on the busbars 4 after the two core constituent portions 31 and 32 are combined. In other words, the value of the projecting height L5 is set such that the end surfaces 35 and 36 do not abut on the opposing surface 33 before the two opposing surfaces 33 and 34 interpose the busbars 4 therebetween.

The core 3 of the present embodiment is configured such that a gap is present between the end surfaces 35 and 36 and the opposing surface 33 when the first and the second core constituent portions 31 and 32 interpose the three busbars 4 therebetween. The adhesive member 7 is solidified in this gap, and bonds the two core constituent portions 31 and 32 together. In the bonding process to bond the two core constituent portions 31 and 32 together, a pressing force in the height direction Z is applied to the first and the second core constituent portions 31 and 32 until the adhesive member 7 is solidified. That is, in the bonding process, the adhesive member 7 is solidified in the state where the busbars 4 are pressed in the height direction Z by the first and the second core constituent portions 31 and 32. The solidified adhesive member 7 makes the first and the second core constituent portions 31 and 32 press and hold the three busbars 4.

The bonding of the first core constituent portion 31 to the second core constituent portion 32 fixes the core 3 to the busbars 4. In the following description, a unit obtained by assembling the core 3, the terminals 5, and the electric wires W to the busbars 4 will be called a cored electric cable 10. In the cored electric cable 10, the first constituent portion 43a and the fifth constituent portion 43e of each of the busbars 4 are held in the pressed state by the first and the second core constituent portions 31 and 32, as illustrated in FIG. 9. Thus, the core 3 of the present embodiment can restrict the busbars 4 from moving. The core 3 restricts, for example, relative movements of the busbars 4 along the axial direction X and the width direction Y. The core 3 restricts the movements of the busbars 4 so as to keep the coatings 45 from being damaged. For example, when the cored electric cable 10 is assembled into the housing member 6, or when the wire harness WH is mounted onto the vehicle, the busbars 4 are restrained from being scraped against the core 3. The first and second core constituent portions 31 and 32 may hold the busbars 4 while compressing the coatings 45, as illustrated in FIG. 10. If the coatings 45 are made of an elastic material, such as a resin, the core 3 holds the busbars 4 while compressing the coatings 45 so as to appropriately reduce displacements of the busbars 4. The cored electric cable 10 is assembled into the housing member 6, as will be described below.

As illustrated in FIG. 11, the housing member 6 includes a main body 61, a tubular portion 62, and a holder 63. The main body 61 and the tubular portion 62 are integrally made of, for example, an insulating synthetic resin. The holder 63 is made of, for example, an insulating synthetic resin. The main body 61 is a box-like constituent portion having a rectangular planar shape. The main body 61 is open on one side in the height direction Z. A core holding portion 64 is provided at a bottom portion of the main body 61. The core holding portion 64 is a groove for holding the core 3. The core holding portion 64 positions the core 3 in each of the axial direction X and the width direction Y. Three holding grooves 66 are formed at a wall portion 65 on one side in the axial direction X of the main body 61. The three holding grooves 66 hold the electric wires W1, W2, and W3. Each of the holding grooves 66 extends along the axial direction X, and has a semicircular sectional shape.

The tubular portion 62 is disposed at an end of the main body 61 on a side opposite to the wall portion 65. The tubular portion 62 is a tubular constituent portion having an oval sectional shape. The central axis line of the tubular portion 62 is directed in the height direction Z. Both ends of the tubular portion 62 are open. As illustrated in FIG. 1, distal end portions 5a of the terminals 5 project into an internal space of the tubular portion 62. The terminals 5 are electrically connected at the distal end portions 5a to a counterpart device, such as the motor. The tubular portion 62 surrounds the distal end portions 5a of the terminals 5 to protect the distal end portions 5a. As illustrated in FIG. 11, the tubular portion 62 has hole portions 62a through which the terminals 5 are inserted. The hole portions 62a communicate an internal space of the main body 61 with the internal space of the tubular portion 62.

The holder 63 has three holding grooves 67 corresponding to the holding grooves 66 of the main body 61. Each of the holding grooves 67 has a semicircular sectional shape. The holder 63 is fixed to the wall portion 65 by a locking mechanism or the like. When the cored electric cable 10 is assembled into the housing member 6, the cored electric cable 10 is first accommodated in the main body 61 and the tubular portion 62. As illustrated in FIG. 12, the distal end portions 5a of the three terminals 5 are inserted into the corresponding hole portions 62a of the tubular portion 62. The second core constituent portion 32 of the core 3 is inserted into the core holding portion 64 of the main body 61. The three electric wires W1, W2, and W3 are placed in the corresponding holding grooves 66. Then, the holder 63 is mounted into the main body 61. The holder 63 holds the electric wires W in conjunction with the wall portion 65. After the holder 63 is mounted onto the main body 61, the conductor unit 1 illustrated in FIGS. 1 and 2 is completed. The connector 2 may be connected to the electric wires W before the cored electric cable 10 is assembled into the housing member 6, or may be connected to the electric wires W after the assembly.

The adhesive member 7 of the present embodiment contains a magnetic material. As a result, appropriate protective characteristics can be achieved in the separate type core 3, as will be described below. As illustrated in FIG. 13, the adhesive member 7 of the present embodiment is interposed between the opposing surface 33 of the first core constituent portion 31 and the end surfaces 35 and 36 of the second core constituent portion 32. That is, the adhesive member 7 is interposed between the first and the second core constituent portions 31 and 32 in the circumferential direction of the core 3. As a result, the gap corresponding to the thickness of the adhesive member 7 is present between the first and the second core constituent portions 31 and 32.

The adhesive member 7 of the present embodiment contains the magnetic material. The magnetic material is, for example, grains or powder of a ferromagnetic material, and is evenly dispersed in the adhesive member 7. As a result, an annular magnetic path is formed by the core 3 and the adhesive member 7 in the conductor unit 1 of the present embodiment. Accordingly, the conductor unit 1 of the present embodiment can appropriately reduce surges in the electric wires W and the busbars 4. In the following description, a unit obtained by bonding together the first and the second core constituent portions 31 and 32 with the adhesive member 7 will be called a "core unit 20". The magnetic characteristics of the core unit 20 are adjusted, for example, by the material, particle size, and shape of the magnetic material in the adhesive member 7, and by the content of the magnetic material in the adhesive member 7. The core unit 20 of the present embodiment is configured to have appropriate surge reduction characteristics (impedance characteristics).

The adhesive member 7 may have an appropriate level of elasticity after being solidified so as to be capable of appropriately protecting the coatings 45 of the busbars 4. The elastically deformable adhesive member 7 can keep the coatings 45 from being damaged, for example, when the cored electric cable 10 is assembled into the housing member 6.

As described above, the conductor unit 1 of the present embodiment includes the busbars 4, the annular core 3, and the adhesive member 7. The busbars 4 are examples of conductors each including the conducting portion 40 covered with the insulating coating 45. The core 3 includes the first core constituent portion 31 and the second core constituent portion 32 combined with the first core constituent portion 31, and interposes the busbars 4 between the first and the second core constituent portions 31 and 32. The adhesive member 7 is an example of a holding member. The adhesive member 7 makes the first and the second core constituent portions 31 and 32 press and hold the busbars 4 therebetween. The conductor unit 1 of the present embodiment holds the busbars 4 in the state of being pressed by the first and the second core constituent portions 31 and 32. As a result, the busbars 4 are restrained from being displaced relative to the core 3, and thus, the coatings 45 can be protected.

When the portions interposed by the core 3 are flat plate-like portions as in the case of the busbars 4 of the present embodiment, the holding state can be easily stabilized. In the present embodiment, each of the busbars 4 is interposed by the core 3 at two portions of the first constituent portion 43a and the fifth constituent portion 43e. As a result, the core 3 can stably hold the busbars 4.

In the present embodiment, the first core constituent portion 31 has a columnar or plate-like shape. The busbars 4 have the spiral portions 43 into which the first core constituent portion 31 is insertable. In the present embodiment, the first core constituent portion 31 is inserted into the busbars 4 having the spiral portions 43 formed in advance. As a result, the assembly process of the conductor unit 1 is more simplified than in a case where a winding operation is needed to wind the electric wires W around the core 3. In the conductor unit 1 of the present embodiment, the core 3 can be assembled to the busbars 4 to which the terminals 5 have been connected in advance. If the terminals have been connected in advance to conductors such as the electric wires W, the operation to wind the conductors around a non-separate type annular core is difficult or impossible to be performed. In contrast, in the conductor unit 1 of the present embodiment, the core 3 can be easily assembled to the busbars 4 to which the terminals 5 have been connected in advance.

Since the spiral portions 43 of the busbars 4 are formed in advance corresponding to the shape of the first core constituent portion 31, the busbars 4 of a plurality of phases can be arranged at a high space occupying rate. The conductor unit 1 including the core 3 can be reduced in height.

The holding member of the present embodiment is the adhesive member 7 that bonds the first core constituent portion 31 and the second core constituent portion 32 together. Since the first core constituent portion 31 is bonded to the second core constituent portion 32 with the adhesive member 7, the core unit 20 is restrained from increasing in size. The core unit 20 is more restrained from increasing in size than, for example, a configuration of holding the core 3 while pressing it from the outside thereof with a holder. The adhesive member 7 can adjust the thickness of the gap in the separate type core 3.

The adhesive member 7 of the present embodiment is interposed between the first and the second core constituent portions 31 and 32 in the circumferential direction of the core 3, and contains the magnetic material. As a result, the first core constituent portion 31, the second core constituent portion 32, and the adhesive member 7 form the annular magnetic path. Consequently, the appropriate impedance characteristics can be ensured in the separate type core 3.

The conductor unit 1 of the present embodiment further includes the terminals 5 and the housing member 6. The terminals 5 are examples of connection members electrically connected to the conductors. The housing member 6 accommodates the terminals 5. The core 3 is accommodated in the housing member 6, and held by the housing member 6. In the conductor unit 1 of the present embodiment, the core 3 holds the busbars 4 while pressing them. As a result, the busbars 4 are restrained from being displaced relative to the core 3, and thus the coatings 45 are protected, during the assembly of the core unit 20 into the housing member 6.

The conductor unit 1 may additionally include the electric wires W. The number of the electric wires W is not limited to three. The shape and the winding number of the busbars 4 are not limited to those exemplified above. For example, the winding number of the busbars 4 may be two or more.

Second Embodiment

Figure 15:
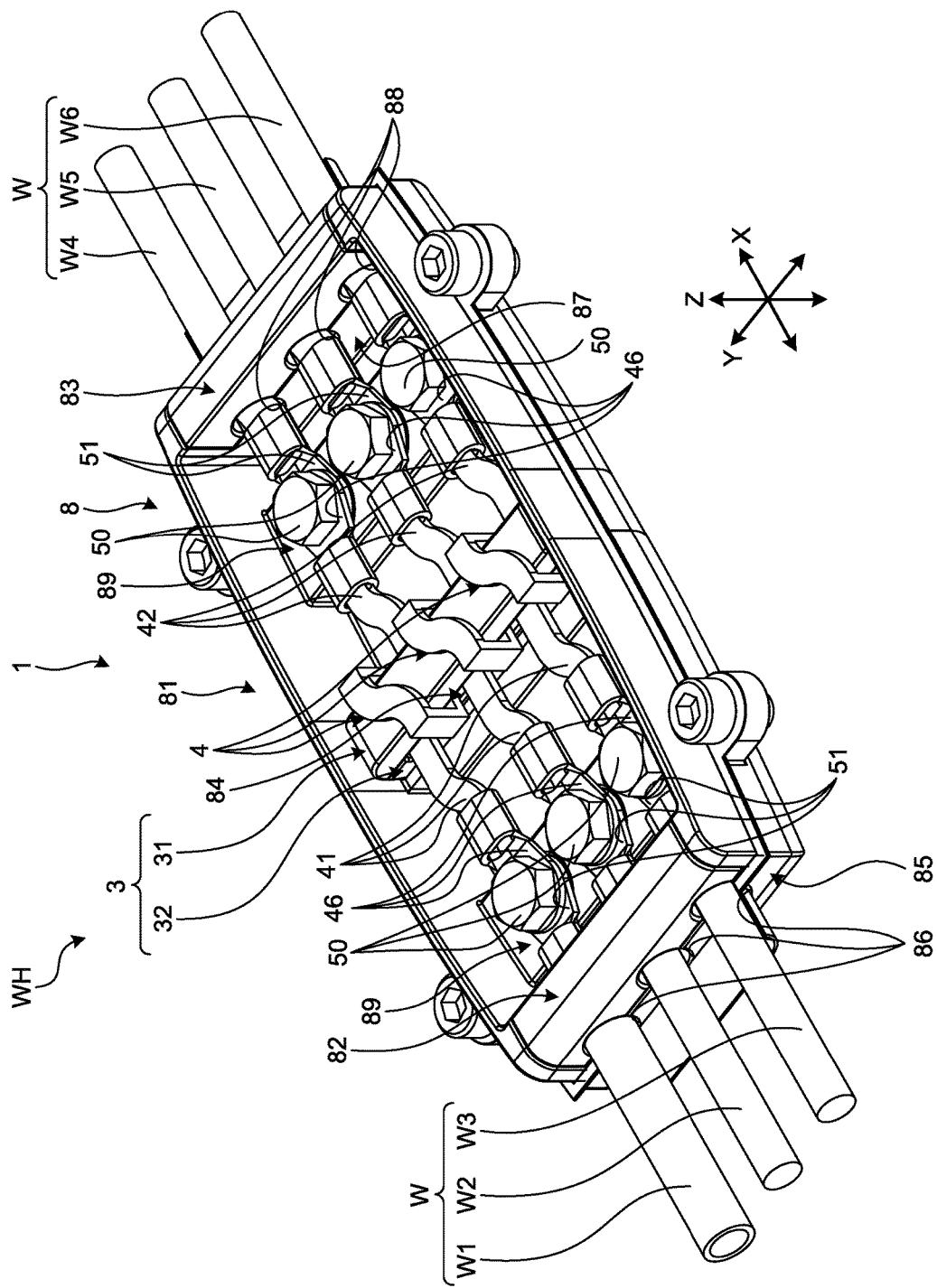
FIG. 15 is a perspective view illustrating the wire harness according to a second embodiment of the present invention.

A second embodiment of the present invention will be described with reference to FIG. 15. In the second embodiment, components having the same functions as those described above in the first embodiment will be assigned with identical reference numerals thereto, and the description thereof will not be repeated. The conductor unit 1 of the second embodiment differs from the conductor unit 1 of the first embodiment described above in that the busbars 4 and the core 3 are disposed at intermediate portions of the electric wires W. FIG. 15 is a perspective view illustrating the conductor unit according to the second embodiment.

As illustrated in FIG. 15, in the conductor unit 1 according to the second embodiment, the electric wires W are connected not only to the first end portions 41 of the busbars 4, but also to the second end portions 42 thereof. That is, the busbars 4 are interposed at the intermediate portions of the electric wires W. The conductor unit 1 of the present embodiment includes the annular core 3, the busbars 4, a housing member 8, and the adhesive member 7. The housing member 8 includes a main body 81, a first holder 82, and a second holder 83. The main body 81 is a box-like constituent portion having a rectangular planar shape. The main body 81 is open on one side in the height direction Z. A core holding portion 84 is provided at a bottom portion of the main body 81. The core holding portion 84 is a groove for holding the core 3. Three holding grooves 86 are formed at a wall portion 85 on one side in the axial direction X of the main body 81. Three holding grooves 88 are formed at a wall portion 87 on the other side in the axial direction X of the main body 81. Each of the holding grooves 86 and 88 extends along the axial direction X, and has a semicircular sectional shape.

The electric wires W1, W2, and W3 are connected to the respective first end portions 41 of the three busbars 4. The electric wires W1, W2, and W3 are connected, for example, to the inverter side. Electric wires W4, W5, and W6 are connected to the respective second end portions 42 of the three busbars 4. The electric wires W4, W5, and W6 are connected, for example, to the motor side.

The core 3 is mounted, for example, to the busbar 4 to which the electric wires W1, W2, W3, W4, W5, and W6 have been connected in advance. In the same manner as in the first embodiment described above, the core 3 interposes the three busbars 4 between the first and the second core constituent portions 31 and 32, and presses the busbars 4 in the height direction Z. The first and second core constituent portions 31 and 32 are bonded to each other by the adhesive member 7 in the same manner as in the first embodiment described above. The core holding portion 84 holds the second core constituent portion 32 of the core 3.

In the present embodiment, fastening members 50 connect the electric wires W1, W2, W3, W4, W5, and W6 to the busbars 4. The housing member 8 is provided with pedestals 89 at two places. The pedestals 89 are raised portions raised from bottom portions of the housing member 8. A terminal 46 is connected to each of the first and the second end portions 41 and 42 of the busbars 4. A terminal 51 is connected to an end of each of the electric wires W1, W2, W3, W4, W5, and W6. Each pair of the terminals 46 and 51 are fastened together to corresponding one of the pedestals 89 with one of the fastening members 50, such as a bolt.

The electric wires W1, W2, and W3 are held by corresponding ones of the holding grooves 86. The first holder 82 holds the electric wires W1, W2, and W3 between itself and the wall portion 85. The electric wires W4, W5, and W6 are held by corresponding ones of the holding grooves 88. The second holder 83 holds the electric wires W4, W5, and W6 between itself and the wall portion 87. The housing member 8 is fixed to the vehicle body of the vehicle. The wire harness WH of the present embodiment includes, for example, terminals and connectors connected to ends of the electric wires W1, W2, W3, W4, W5, and W6, in addition to the conductor unit 1 illustrated in FIG. 15.

In the conductor unit 1 of the present embodiment, the housing member 8 can be disposed in any position in a routing path of the electric wires W. Accordingly, the housing member 8 can be disposed at a place in the routing path of the electric wires W where an arrangement space of the housing member 8 can be easily ensured, or where the housing member 8 can be easily mounted to the vehicle body.

Modifications of Above-Described Embodiments

Modifications of the first and the second embodiments described above will be described. In the above-described embodiments, the conductors are not limited to the busbars 4. The conductors may be, for example, coated electric wires. For example, in the above-described embodiments, the core 3 may be mounted to the flexible electric wires W. In this case, for example, spiral portions having spiral shapes may be formed in advance in the electric wires W, and the first core constituent portion 31 may be inserted into the spiral portions. Instead, the electric wires W may be wound around the first core constituent portion 31 (or the second core constituent portion 32). Then, the first core constituent portion 31 is bonded to the second core constituent portion 32. The second core constituent portion 32 interposes the electric wires W between itself and the first core constituent portion 31, and holds the electric wires W in the pressed state. In the case where the core 3 holds the electric wires W, the busbars 4 of the above-described embodiments may be omitted.

The conductors need not be wound around the core 3. That is, the conductors, such as the busbars or the electric wires, may simply pass through the space between the first and the second core constituent portions 31 and 32 in the axial direction.

The adhesive member 7 may be an adhesive sheet. Both surfaces of the adhesive sheet are adhesive surfaces, and are stuck to the opposing surface 33 of the first core constituent portion 31 and the end surfaces 35 and 36 of the second core constituent portion 32. The adhesive sheet may contain a magnetic material. The adhesive sheet may be made by providing, for example, adhesive layers on both surfaces of a magnetic layer containing the magnetic material. The adhesive sheet may have elasticity. The holding member for making the first and the second core constituent portions 31 and 32 press and hold the conductors therebetween is not limited to the adhesive member 7. The holding member may be an elastic body, such as a holder or rubber, configured to hold the conductors in the pressed state by applying an external force to the core 3 or a core 9.

The inner circumferential surface of the core 3 may be provided with projections and/or grooves for positioning the conductors. For example, the opposing surface 33 of the first core constituent portion 31 and/or the opposing surface 34 of the second core constituent portion 32 may be provided with the projections and/or the grooves for positioning.

Figure 16:
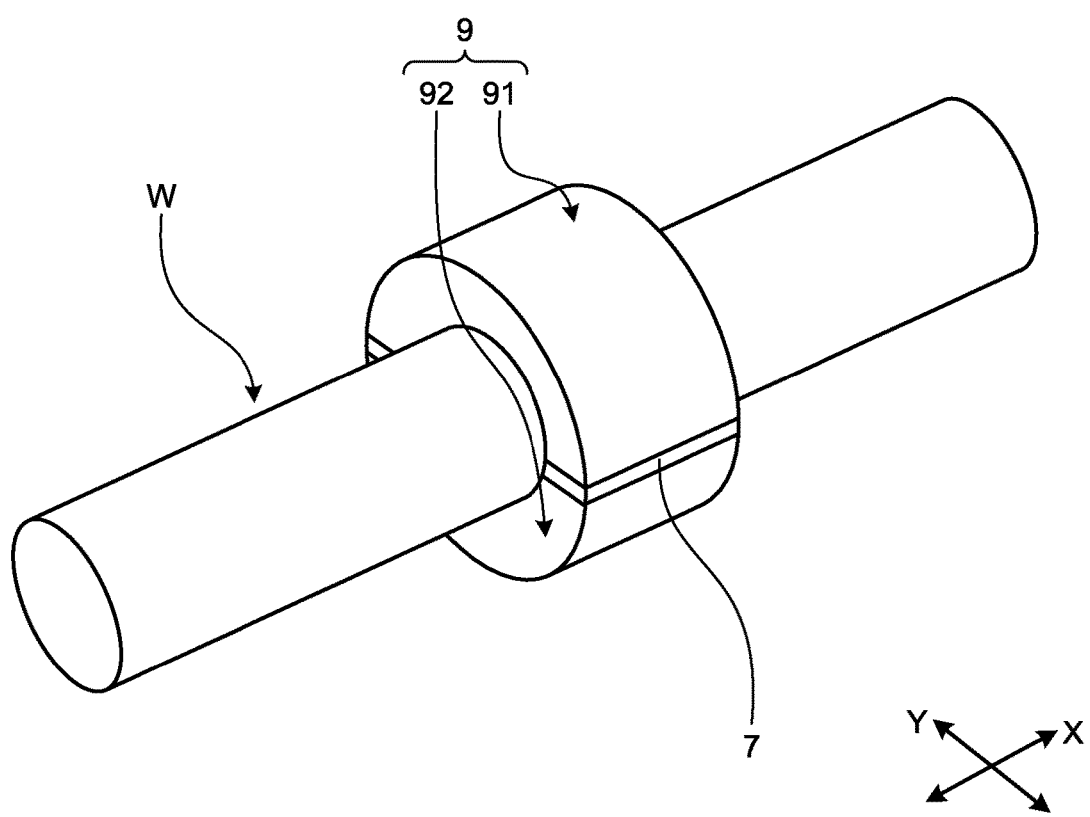
FIG. 16 is a perspective view illustrating an exemplary core.

One core may hold one conductor, as illustrated in FIG. 16. The core 9 illustrated in FIG. 16 includes a first core constituent portion 91 and a second core constituent portion 92. Each of the first and the second core constituent portions 91 and 92 has a shape obtained by splitting a hollow cylinder into two. The first core constituent portion 91 is bonded to the second core constituent portion 92 with the adhesive member 7. The first and second core constituent portions 91 and 92 interpose one electric wire W therebetween, and hold it in the pressed state. In the case of holding a plurality of such electric wires W, a plurality of such first core constituent portions 91 may be connected along the width direction Y, and a plurality of such second core constituent portions 92 may be connected along the width direction Y.

The content disclosed in the embodiments and the modifications thereof described above can be carried out in appropriate combinations thereof.

The conductor unit according to the present embodiments and the modifications includes the conductors each including the conducting portion covered with the insulating coating, the annular core that includes the first core constituent portion and the second core constituent portion combined with the first core constituent portion, and that interposes the conductors between the first and the second core constituent portions, and the holding member that makes the conductors held in the state of being pressed by the first core constituent portion and the second core constituent portion. The conductor unit according to the present embodiments and the modifications provides an effect that the coatings are protected because the conductors are held in the pressed state.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A conductor unit comprising:
a plurality of conductors each including a conducting portion covered with an insulating coating;
an annular core made of magnetic material that includes a first core constituent portion and a second core constituent portion combined with the first core constituent portion, and that interposes the conductors between the first core constituent portion and the second core constituent portion; and
a holding member that makes the first core constituent portion and the second core constituent portion press and hold the conductors therebetween, wherein
the first core constituent portion has a columnar or plate-like shape, and
the conductors are busbars each having a spiral portion into which the first core constituent portion is insertable.

2. The conductor unit according to claim 1, wherein the holding member is an adhesive member that bonds the first core constituent portion and the second core constituent portion together.

3. The conductor unit according to claim 2, wherein the adhesive member is interposed between the first core constituent portion and the second core constituent portion in a circumferential direction of the core, and contains a magnetic material.

4. The conductor unit according to claim 3, further comprising:
a plurality of connection members electrically connected to the respective conductors; and
a housing member that accommodates the connection members, wherein
the core is accommodated in the housing member, and held by the housing member.

5. The conductor unit according to claim 2, further comprising:
a plurality of connection members electrically connected to the respective conductors; and
a housing member that accommodates the connection members, wherein
the core is accommodated in the housing member, and held by the housing member.

6. The conductor unit according to claim 1, further comprising:
a plurality of connection members electrically connected to the respective conductors; and
a housing member that accommodates the connection members, wherein
the core is accommodated in the housing member, and held by the housing member.

* * * * *